United States Patent [19]

Sakurai

[11] Patent Number: 4,853,934
[45] Date of Patent: Aug. 1, 1989

[54] SEMICONDUCTOR LASER CONTROL APPARATUS

[75] Inventor: Tatsuaki Sakurai, Machida, Japan

[73] Assignee: Ricoh Company, Ltd., Tokyo, Japan

[21] Appl. No.: 270,523

[22] Filed: Nov. 14, 1988

[30] Foreign Application Priority Data

Nov. 20, 1987 [JP] Japan .................. 62-293608

[51] Int. Cl.[4] .............................................. H01S 3/13
[52] U.S. Cl. ..................................... 372/29; 250/205; 372/31
[58] Field of Search ............................ 372/29, 31, 38; 250/205

[56] References Cited

U.S. PATENT DOCUMENTS

| 4,618,958 | 10/1986 | Shibata et al. | 372/29 |
| 4,718,068 | 1/1988 | Yoshikawa | 372/38 |
| 4,734,914 | 3/1988 | Yoshikawa | 372/38 |
| 4,745,609 | 5/1988 | Yoshikawa | 372/38 |
| 4,754,460 | 6/1988 | Kimura et al. | 372/38 |
| 4,763,334 | 8/1988 | Shimada et al. | 372/29 |

FOREIGN PATENT DOCUMENTS 59-18964  1/1984  Japan .

Primary Examiner—James W. Davie
Attorney, Agent, or Firm—Cooper & Dunham

[57] ABSTRACT

A semiconductor laser control apparatus comprises a light receiving part for receiving a laser beam emitted from a semiconductor laser, a comparator for comparing an output signal of the light receiving part and a reference signal having a level corresponding to a desired target value of the optical output, a clock generator for generating clock pulses, an up-down counter for counting the clock pulses and carrying out one of an up-count and a down-count responsive to a first control signal, a control part for controlling the clock generator and the up-down counter responsive to an error signal from the comparator, and a driving part for driving the semiconductor laser by supplying a current proportional to a counted value of the up-down counter. The control part outputs the first control signal which determines one of the up-count and the down-count depending on whether an output signal level of the light receiving part is lower or higher than the level of the reference signal and outputs a second control signal which is supplied to the clock generator and variably controls a frequency of the clock pulses depending on an absolute value of the error signal.

19 Claims, 2 Drawing Sheets

SEMICONDUCTOR LASER CONTROL APPARATUS

BACKGROUND OF THE INVENTION

The present invention generally relates to semiconductor laser control apparatuses, and more particularly to a semiconductor laser control apparatus for controlling a semiconductor laser which is used as a light source in an optical disc apparatus, a laser beam printer and the like.

A control to stabilize an optical output of a semiconductor laser which is used as a light source of an optical disc apparatus, a laser beam printer and the like is essential in order to stably carry out a recording, a reproduction and an erasure of an information with respect to an optical disc on the optical disc apparatus and in order to stably write an information optically with respect to a sheet of paper on the laser beam printer.

Conventionally, a semiconductor laser control apparatus shown in FIG. 1 is used to stabilize the optical output of the semiconductor laser. In FIG. 1, a laser beam emitted from a semiconductor laser 1 is received by a light receiving element 2 and subjected to a photoelectric conversion. An output signal of the light receiving element 2 is amplified in an amplifier 3 and is supplied to a comparator 4. The comparator 4 compares an output voltage of the amplifier 3 with a reference voltage Vref, and signal indicative of a result of the comparison is supplied to an up-down counter 5 as an up-down signal.

The up-down signal becomes an up-signal which instructs an up-count when the output voltage of the amplifier 3 is lower than the reference voltage Vref. On the other hand, the up-down signal becomes an down-signal which instructs a down-count when the output voltage of the amplifier 3 is higher than the reference voltage Vref. The up-down counter 5 counts up or counts down clock pulses of a constant frequency obtained from an oscillator 6 depending on whether the up-signal or the down-signal is obtained from the comparator 4. An output counted value in the up-down counter is converted into an analog signal in a digital-to-analog (D/A) converter 7. The analog signal from the D/A converter 7 is supplied to a semiconductor laser driving circuit 8 which supplies to the semiconductor laser 1 a current proportional to the analog signal. As a result, the optical output of the semiconductor laser 1 is stabilized to a value corresponding to the reference voltage Vref.

However, according to the conventional semiconductor laser control apparatus, the following problems occur when it is used for controlling the light source of the optical disc apparatus, for example. In other words, in a reproducing mode when an information is reproduced from an optical disc (not shown), the up-down counter 5 repeats an up-count and a down-count. For this reason, a ripple is generated in the optical output of the semiconductor laser 1 as shown in FIG. 2 with a frequency which is ½ the frequency of the clock pulses supplied to the up-down counter 5 from the oscillator 6.

When an oscillator having an oscillation frequency of several kHz, for example, and avoiding a frequency band of the reproduced signal from the optical disc which is generally in a range of several tens of kHz to several MHz is used as the oscillator 6, there is a problem in that a rising speed with which the optical output of the semiconductor laser 1 rises to a predetermined value when turned ON becomes extremely slow. But on the other hand, when an oscillator having an oscillation frequency of several tens of MHz is used as the oscillator 6, there is a possibility that an even large ripple will be generated in the optical output of the semiconductor laser 1 due to a delay introduced in the amplifier 3.

Another type of semiconductor laser control apparatus using an up-down counter is disclosed in a Japanese Laid-Open Patent Application No. 59-18964, but this other semiconductor laser control apparatus suffers problems similar to those of the conventional semiconductor laser control apparatus shown in FIG. 1.

SUMMARY OF THE INVENTION

Accordingly, it is a general object of the present invention to provide a novel and useful semiconductor laser control apparatus in which the problems described above are eliminated.

Another and more specific object of the present invention is to provide a semiconductor laser control apparatus which stably controls an optical output of a semiconductor laser and also ensures that the optical output of the semiconductor laser rises with a high rising speed when turned ON.

Still another object of the present invention is to provide a semiconductor laser control apparatus for controlling an optical output of a semiconductor laser comprising light receiving means for receiving a laser beam emitted from the semiconductor laser and for outputting an output signal by carrying out a photoelectric conversion, comparator means for comparing the output signal of the light receiving means and a reference signal and for outputting an error signal indicative of an error between the two compared signals, where the reference signal has a level corresponding to a desired target value of the optical output which is to be obtained from the semiconductor laser, clock generating means for generating clock pulses, up-down counter means for counting the clock pulses from the clock generating means, where the up-down counter carries out one of an up-count and a down-count responsive to a first control signal, control means for controlling the clock generating means and the up-down counter means responsive to the error signal from the comparator means, and driving means for driving the semiconductor laser by supplying a current proportional to a counted value of the up-down counter means. The control means outputs the first control signal which determines one of the up-count and the down-count of the up-down counter means depending on whether a level of the output signal of the light receiving means is lower or higher than the level of the reference signal and outputs a second control signal which is supplied to the clock generating means and variably controls a frequency of the clock pulses depending on an absolute value of the error signal from the comparator means. According to the semiconductor laser control apparatus of the present invention, it is possible to stably control the optical output of the semiconductor laser and also ensure that the optical output of the semiconductor laser rises with a high rising speed when turned ON.

Other objects and further features of the present invention will be apparent from the following detailed description when read in conjunction with the accompanying drawings.

DETAILED DESCRIPTION

Figure 1:
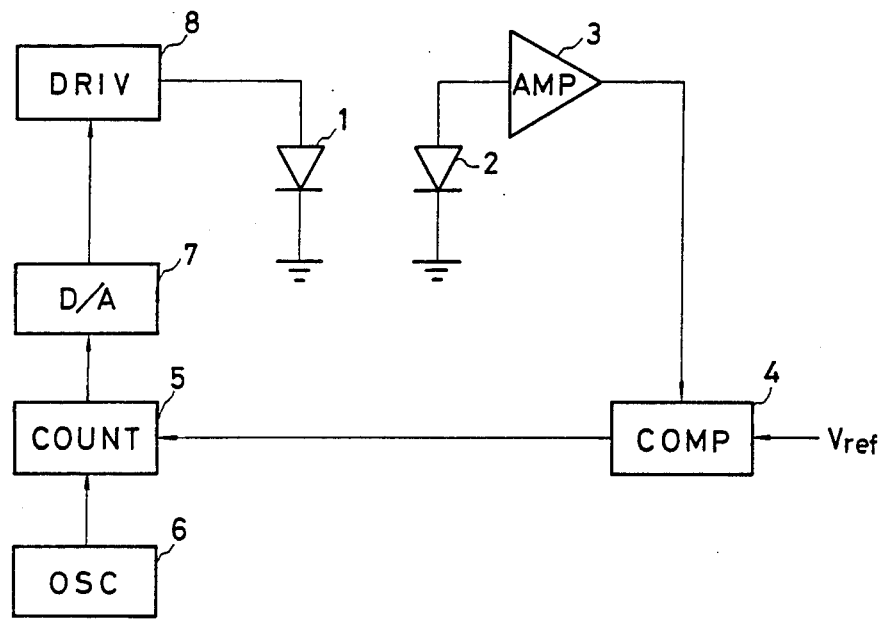
FIG. 1 is a system block diagram showing an example of a conventional semiconductor laser control apparatus.
Figure 2:
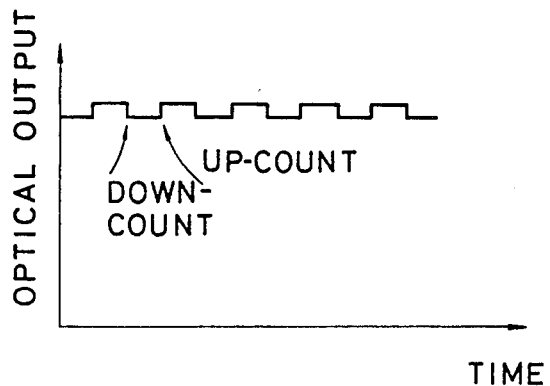
FIG. 2 shows an optical output of a semiconductor laser versus time characteristic of a semiconductor laser controlled by the conventional semiconductor laser control apparatus shown in FIG. 1.
Figure 3:
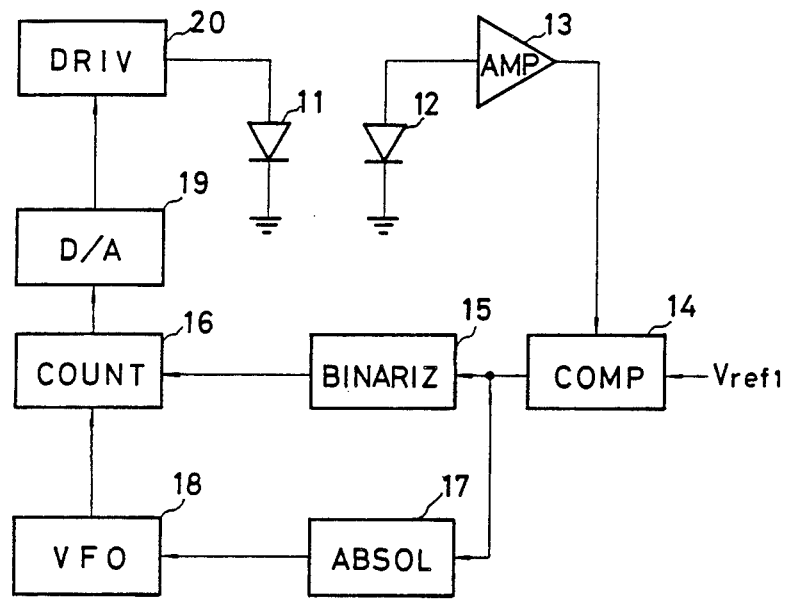
FIG. 3 is a system block diagram showing a first embodiment of a semiconductor laser control apparatus according to the present invention.

FIG. 3 shows a first embodiment of a semiconductor laser control apparatus according to the present invention. In FIG. 3, a laser beam emitted from a semiconductor laser 11 is received by a light receiving element 12 and subjected to a photoelectric conversion. An output signal of the light receiving element 12 is amplified in an amplifier 13 and is supplied to a comparator 14. The comparator 14 compares an output voltage of the amplifier 13 with a reference voltage Vref1, and an error signal indicative of a result of the comparison, that is, an error between the two compared voltages, is supplied to a binarization circuit 15. The binarization circuit 15 supplies a binary signal indicative of the error to an up-down counter 16 as an up-down signal.

The up-down signal becomes an up-signal which instructs an up-count when the output voltage of the amplifier 13 is lower than the reference voltage Vref1, that is, the optical output of the semiconductor laser 11 is less than a target value. On the other hand, the up-down signal becomes an down-signal which instructs a down-count when the output voltage of the amplifier 13 is higher than the reference voltage Vref1, that is, the optical output of the semiconductor laser 11 is greater than the target value. The up-down counter 16 counts up or counts down clock pulses obtained from a variable frequency oscillator 18 depending on whether the up-signal or the down-signal is obtained from the binarization circuit 15. An output counted value in the up-down counter 16 is converted into an analog signal in a digital-to-analog (D/A) converter 19. The analog signal from the D/A converter 19 is supplied to a semiconductor laser driving circuit 20 which supplies to the semiconductor laser 11 a current proportional to the analog signal. As a result, the optical output of the semiconductor laser 11 is stabilized to a value corresponding to the reference voltage Vref1.

On the other hand, the error signal from the comparator 14 is supplied to an absolute value circuit 17 which obtains an absolute value of the error signal. An output signal of the absolute value circuit 17 indicative of the obtained absolute value is supplied to the variable frequency oscillator 18 so as to variably control an oscillation frequency of the variable frequency oscillator 18. In other words, the frequency of the clock pulses supplied to the up-down counter 16 is variably controlled by the output signal of the absolute value circuit 17.

Accordingly, when the optical output of the semiconductor laser 11 greatly differs from the target value and a large error signal is obtained from the comparator 14, the oscillation frequency of the variable frequency oscillator 18 is increased so as to quickly make the optical output of the semiconductor laser 11 approach the target value. In addition, when the optical output of the semiconductor laser 11 is sufficiently close to the target value and a sufficiently small error signal is obtained from the comparator 14, the oscillation frequency of the variable frequency oscillator 18 is controlled to a sufficiently low frequency so that it is possible to obtain a stable optical output of the semiconductor laser 11 including no ripple.

Figure 4:
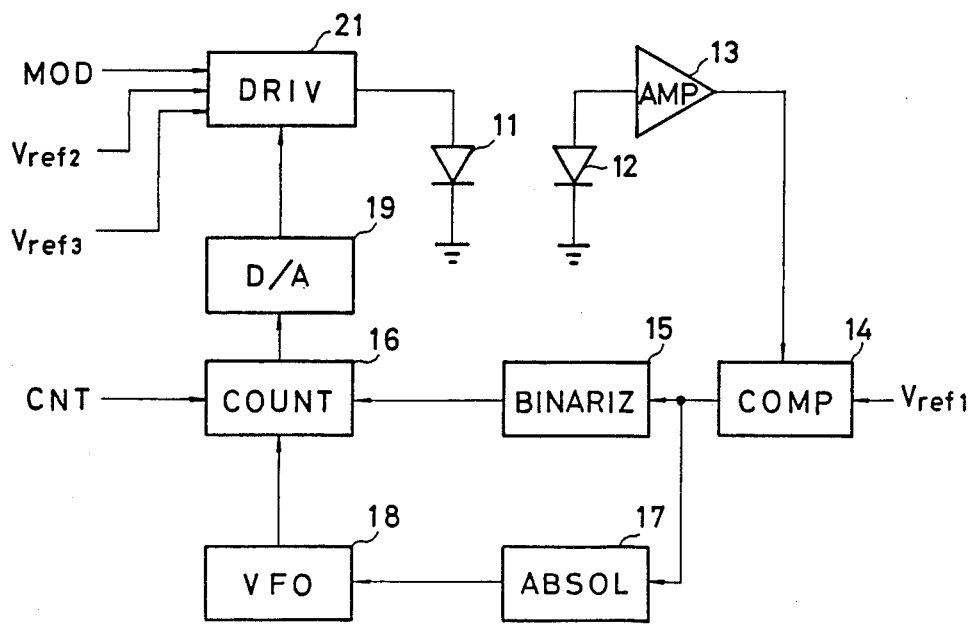
FIG. 4 is a system block diagram showing a second embodiment of the semiconductor laser control apparatus according to the present invention.

FIG. 4 shown a second embodiment of the semiconductor laser control apparatus according to the present invention. In FIG. 4, those parts which are essentially the same as those corresponding parts in FIG. 3 are designated by the same reference numerals, and a description thereof will be omitted. When the semiconductor laser 11 is used as a light source of an optical information recording and/or reproducing apparatus such as a photo-electromagnetic disc apparatus, it is necessary to obtain high reproduction power, erasure power and recording power when carrying out the reproduction, erasure and recording with respect to a recording medium (optical disc).

In a reproducing mode when a high reproduction power is to be obtained from the semiconductor laser 11, a semiconductor laser driving circuit 21 operates similarly to the semiconductor laser driving circuit 20 of the first embodiment and supplies to the semiconductor laser 11 a current proportional to the analog signal obtained from the D/A converter 19.

During an erasing mode when a high erasure power is to be obtained from the semiconductor laser 11, an external control signal CNT is supplied to the up-down counter 16 from an external circuit (not shown) to stop the counting operation of the up-down counter 16. Hence, the semiconductor laser driving circuit 21 not only supplies to the semiconductor laser 11 a current proportional to the analog signal obtained from the D/A converter 19 but also supplies a current proportional to a reference voltage Vref2 so as to obtain the necessary high erasure power from the semiconductor laser 11. The reference voltage Vref2 is preset and supplied to the semiconductor laser driving circuit 21 from an external circuit (not shown).

In a recording mode when a high recording power is to be obtained from the semiconductor laser 11, the external control signal CNT is supplied to the up-down counter 16 from an external circuit (not shown) to stop the counting operation of the up-down counter 16. Hence, the semiconductor laser driving circuit 21 not only supplies to the semiconductor laser 11 a current proportional to the analog signal obtained from the D/A converter 19 but also supplies a current proportional to a reference voltage Vref3 so as to obtain the necessary high recording power from the semiconductor laser 11. The reference voltage Vref3 is preset and supplied to the semiconductor laser driving circuit 21 from an external circuit (not shown). In addition, in the recording mode, a modulation signal MOD is supplied to the semiconductor laser driving circuit 21 from an external circuit (not shown), and the semiconductor laser driving circuit 21 modulates an information to be recorded by use of the laser beam emitted from the semiconductor laser 11.

Therefore, according to the described embodiments and the present invention, it is possible to stably control the optical output of the semiconductor laser by variably controlling the frequency of the clock pulses counted by the up-down counter depending on the error between the optical output of the semiconductor laser and the target value. Moreover, the optical output of the semiconductor laser is controlled to rise with a high rising speed when turned ON.

Further, the present invention is not limited to these embodiments, but various variations and modifications may be made without departing from the scope of the present invention.

What is claimed is:

1. A semiconductor laser control apparatus for controlling an optical output of a semiconductor laser, said semiconductor laser control apparatus comprising:

light receiving means for receiving a laser beam emitted from the semiconductor laser and for outputting an output signal by carrying out a photoelectric conversion;

comparator means for comparing the output signal of said light receiving means and a reference signal and for outputting an error signal indicative of an error between the two compared signals, said reference signal having a level corresponding to a desired target value of the optical output which is to be obtained from said semiconductor laser;

clock generating means for generating clock pulses;

up-down counter means for counting the clock pulses from said clock generating means, said up-down counter carrying out one of an up-count and a down-count responsive to a first control signal;

control means for controlling said clock generating means and said up-down counter means responsive to the error signal from said comparator means; and driving means for driving the semiconductor laser by supplying a current proportional to a counted value of said up-down counter means, said control means outputting the first control signal which determines one of the up-count and the down-count of said up-down counter depending on whether a level of the output signal of said light receiving means is lower or higher than the level of said reference signal and ouputting a second control signal which is supplied to said clock generating means and variably controls a frequency of the clock pulses depending on an absolute value of the error signal from said comparator means.

2. A semiconductor laser control apparatus as claimed in claim 1 in which said control means includes a circuit for converting the error signal from said comparator means into a binary signal and for outputting this binary signal as said first control signal.

3. A semiconductor laser control apparatus as claimed in claim 1 in which said control means includes a circuit for obtaining an absolute value of the error signal from said comparator means and for outputting a signal indicative of the absolute value as said second control signal.

4. A semiconductor laser control apparatus as claimed in claim 1 in which said control means includes a first circuit for converting the error signal from said comparator means into a binary signal and for outputting this binary signal as said first control signal, and a second circuit for obtaining an absolute value of the error signal from said comparator means and for outputting a signal indicative of the absolute value as said second control signal.

5. A semiconductor laser control apparatus as claimed in claim 1 in which said light receiving means includes a light receiving element for receiving the laser beam emitted from the semiconductor laser and an amplifier for amplifying an output signal of said light receiving element into the output signal of said light receiving means.

6. A semiconductor laser control apparatus as claimed in claim 1 in which said clock generating means is constituted by a variable frequency oscillator.

7. A semiconductor laser control apparatus as claimed in claim 1 in which said driving means includes a digital-to-analog converter for converting the counted value of said up-down counter means into a digital signal, and a driving circuit for supplying to the semiconductor laser a current proportional to the digital signal from said digital-to-analog converter.

8. A semiconductor laser control apparatus as claimed in claim 1 in which said control means outputs a second control signal which increases the frequency of the clock pulses when the optical output of the semiconductor laser differs from said target value by more than a certain value.

9. A semiconductor laser control apparatus for controlling an optical output of a semiconductor laser which is used as a light source of an optical information recording and/or reproducing apparatus having a reproducing mode, a recording mode and an erasing mode, said optical information recording and/or reproducing apparatus reproducing, recording and erasing an information with respect to a recording medium by use of a laser beam emitted from said semiconductor laser, said semiconductor laser control apparatus comprising:

light receiving means for receiving the laser beam emitted from the semiconductor laser and for outputting an output signal by carrying out a photoelectric conversion;

comparator means for comparing the output signal of said light receiving means and a reference signal and for outputting an error signal indicative of an error between the two compared signals, said reference signal having a level corresponding to a desired target value of the optical output which is to be obtained from said semiconductor laser;

clock generating means for generating clock pulses;

up-down counter means for counting the clock pulses from said clock generating means, said up-down counter carrying out one of an up-count and a down-count responsive to a first control signal;

control means for controlling said clock generating means and said up-down counter means responsive to the error signal from said comparator means; and driving means for driving the semiconductor laser by supplying a current proportional to a counted value of said up-down counter means, said control means outputting the first control signal which determines one of the up-count and the down-count of said up-down counter means depending on whether a level of the output signal of said light receiving means is lower or higher than the level of said reference signal and outputting a second control signal which is supplied to said clock generating means and variably controls a frequency of the clock pulses depending on an absolute value of the error signal from said comparator means.

10. A semiconductor laser control apparatus as claimed in claim 9 in which said control means includes a circuit for converting the error signal from said comparator means into a binary signal and for outputting this binary signal as said first control signal.

11. A semiconductor laser control apparatus as claimed in claim 9 in which said control means includes a circuit for obtaining an absolute value of the error signal from said comparator means and for outputting a signal indicative of the absolute value as said second control signal.

12. A semiconductor laser control apparatus as claimed in claim 9 in which said control means includes a first circuit for converting the error signal from said comparator means into a binary signal and for outputting this binary signal as said first control signal, and a second circuit for obtaining an absolute value of the error signal from said comparator means and for outputting a signal indicative of the absolute value as said second control signal.

13. A semiconductor laser control apparatus as claimed in claim 9 in which said light receiving means includes a light receiving element for receiving the laser beam emitted from the semiconductor laser and an amplifier for amplifying an output signal of said light receiving element into the output signal of said light receiving means.

14. A semiconductor laser control apparatus as claimed in claim 9 in which said clock generating means is constituted by a variable frequency oscillator.

15. A semiconductor laser control apparatus as claimed in claim 9 in which said driving means includes a digital-to-analog converter for converting the counted value of said up-down counter means into a digital signal, and a driving circuit for supplying to the semiconductor laser a current proportional to the digital signal from said digital-to-analog converter.

16. A semiconductor laser control apparatus as claimed in claim 9 in which said up-down counter means stops the counting operation responsive to a first external signal and said driving means supplies an additional current proportional to a second external signal in said erasing mode, thereby increasing an erasure power of the laser beam in said erasing mode.

17. A semiconductor laser control apparatus as claimed in claim 9 in which said up-down counter means stops the counting operation responsive to a first external signal and said driving means supplies an additional current proportional to a second external signal in said recording mode, thereby increasing a recording power of the laser beam in said recording mode.

18. A semiconductor laser control apparatus as claimed in claim 17 in which said driving means receives an external modulation signal and modulates an information to be recorded in said recording mode by use of the laser beam emitted from the semiconductor laser.

19. A semiconductor laser control apparatus as claimed in claim 9 in which said control means outputs a second control signal which increases the frequency of the clock pulses when the optical output of the semiconductor laser differs from said target value by more than a certain value.

* * * * *